the resist mask; and patterning the second conductive layer and the capacitor insulation film by using the patterned second insulation film as a hard mask. By dry etching using a hard mask, a dielectric capacitor having a three-dimensionally stacked structure can be formed with a high yield.
United States Patent
Yoshida et al.

(10) Patent No.: US 7,776,707 B2
(45) Date of Patent: Aug. 17, 2010

(54) METHOD FOR MANUFACTURING DIELECTRIC MEMORY

(75) Inventors: Hiroshi Yoshida, Toyama (JP); Toyoji Ito, Toyama (JP); Yoshihisa Nagano, Niigata (JP)

(73) Assignee: Panasonic Corporation, Osaka (JP)

( * ) Notice: Subject to any disclaimer, the term of this patent is extended or adjusted under 35 U.S.C. 154(b) by 438 days.

(21) Appl. No.: 11/758,376

(22) Filed: Jun. 5, 2007

(65) Prior Publication Data
US 2007/0287249 A1   Dec. 13, 2007

(30) Foreign Application Priority Data
Jun. 7, 2006   (JP) ............... 2006-158957

(51) Int. Cl.
*H01L 21/20* (2006.01)
(52) U.S. Cl. ............... 438/387; 257/E27.084
(58) Field of Classification Search ............... 438/387, 438/239, 253; 257/E27.084, E27.087
See application file for complete search history.

(56) References Cited
U.S. PATENT DOCUMENTS
6,693,319 B1 *   2/2004   Durcan et al. ............... 257/308

2006/0038217 A1 *   2/2006   Mikawa et al. ............... 257/306

FOREIGN PATENT DOCUMENTS
JP   2003-258201   9/2003

* cited by examiner

*Primary Examiner*—David Vu

(57) ABSTRACT

A method includes the steps of: forming a first insulation film on a substrate; forming a hole in the first insulation film; forming a lower electrode on a bottom surface and a sidewall surface of the hole; forming a capacitor insulation film on the lower electrode; forming a second conductive layer on the capacitor insulation film; forming a second insulation film on the second conductive layer so that the second insulation film fills a recess corresponding to the hole; forming a resist mask on the second insulation film so that the resist mask covers the recess; patterning the second insulation film by using the resist mask; and patterning the second conductive layer and the capacitor insulation film by using the patterned second insulation film as a hard mask. By dry etching using a hard mask, a dielectric capacitor having a three-dimensionally stacked structure can be formed with a high yield.

8 Claims, 6 Drawing Sheets

METHOD FOR MANUFACTURING DIELECTRIC MEMORY

BACKGROUND OF THE INVENTION

1. Field of the Invention

The present invention relates to a method for manufacturing a dielectric memory having a capacitor element in a three-dimensionally stacked structure.

2. Description of Related Art

A ferroelectric memory is one kind of non-volatile memories in which ferroelectric materials are used. With advanced microstructure and higher-level integration of semiconductor devices in these days, the microstructuring of ferroelectric memories has been demanded. To microstructure a capacitor part, a micromachining technique is required.

However, the materials used for forming a ferroelectric capacitor, such as Pt, Ir, PZT, are very difficult to etch. Particularly, in the dry etching of Pt or Ir, residues called "fence" are generated in a resist forming process used in the LSI manufacturing process, and become an obstacle to the micromachining. Therefore, the dry etching of Pt or Ir uses a high-temperature dry etching process using a hard mask (see e.g. JP 2003-258201 A).

To make memory cells further finer, a capacitor of a three-dimensionally stacked structure, in which a dielectric capacitor is formed in a hole or a trench, is used as an approach to secure an area for a ferroelectric capacitor. This makes it possible to secure a larger overall area for a capacitor with a small projection area.

However, the inventors of the present application have found that when the above-mentioned conventional etching process using a hard mask is applied to such a ferroelectric capacitor of the three-dimensionally stacked structure, the following problems occur.

First, when a usual film forming method (e.g. sputtering) is used, in a hole or trench having a large aspect ratio, a film has significantly different film thicknesses on upper area, sidewall, and bottom of the hole or trench, respectively. This causes a hard mask on bottom of the hole or trench to have a film thickness smaller than a film thickness on outside areas of the hole or trench.

As a result, the following problem occurs. After depositing materials for a lower electrode, a ferroelectric film, and an upper electrode in the hole or trench, when the ferroelectric film and the upper electrode are subjected to etching using a hard mask, a portion of the hard mask on bottom of the hole or trench is etched also at the same time, thereby decreasing a film thickness. The decrease in the film thickness of the hard mask causes pin holes to be formed, which result in a problem that a chemical solution used in a later washing process remains in the hole or the trench, thereby damaging a capacitor, and decreasing the yield.

Further, there also is the following problem. When a hard mask is formed by etching using a resist process, the resist remains in hole or trench as particles, causing a decrease in the yield in a later process.

SUMMARY OF THE INVENTION

In light of the above-described problems, it is an object of the present invention to increase the yield in the manufacture of a dielectric memory in which a hard mask is applied to recesses having a high aspect ratio.

To achieve the above-described object, the method of the present invention for manufacturing a dielectric memory includes the steps of: forming a first insulation film on a substrate; forming a hole in the first insulation film; forming a first conductive layer on a bottom surface and a sidewall surface of the hole; forming a dielectric layer on the first conductive layer; forming a second conductive layer on the dielectric layer; forming a second insulation film on the second conductive layer so that the second insulation film fills a recess corresponding to the hole; forming a resist mask on the second insulation film so that the resist mask covers the recess; patterning the second insulation film by using the resist mask; and patterning the second conductive layer and the dielectric layer by using the patterned second insulation film as a hard mask.

DETAILED DESCRIPTION OF THE INVENTION

Figure 1A:
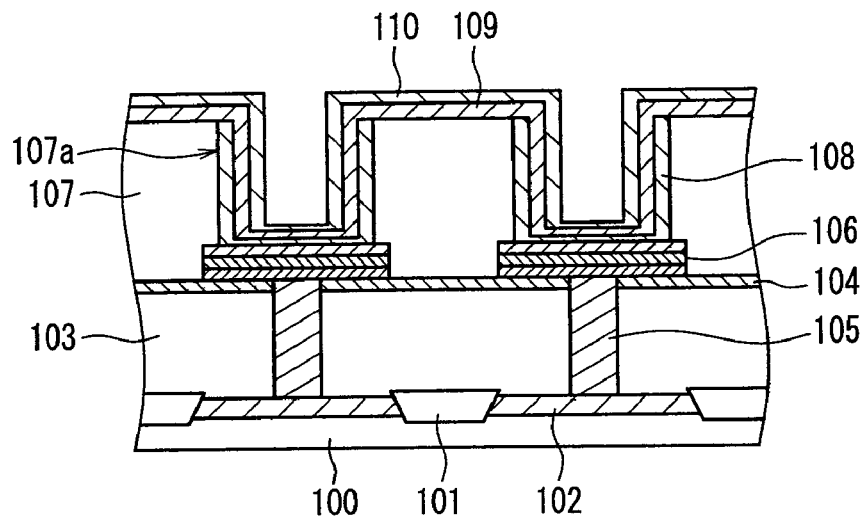
FIGS. 1A to 1E are cross-sectional views illustrating steps of a method for manufacturing a dielectric memory according to Embodiment 1 of the present invention.

According to the method of the present invention for manufacturing a dielectric memory, a hole is formed in a first insulation film formed on the substrate, then, a first conductive layer, a dielectric layer, and a second conductive layer are formed, and thereafter a second insulation film is formed so as to fill a recess corresponding to the hole. Then, the second conductive layer and the dielectric layer are patterned by using a hard mask obtained by patterning the second insulation film.

Thus, by filling the hard mask material into a recess having a greater aspect ratio, a sufficient hard mask film thickness can be ensured with respect to the bottom of the recess, even by a film forming method in which the hard mask material film has different film thicknesses on the bottom of the recess and outside the recess, respectively. Besides, since the hard mask material is filled in the recess, when a heat treatment is carried out in a later step, migration of an electrode material of the ferroelectric capacitor can be suppressed, whereby breaks in a wiring layer can be prevented. Further, resist residues are not generated in the insides of the recesses when the hard mask is formed by using the resist mask. Therefore, a decrease in the yield due to influences of particles resulting from resist residues does not occur. Still further, since a chemical solution does not remain inside the recesses in a washing step subsequent to the etching step, damages to the capacitor because of a chemical solution remaining therein do not occur, and hence, does not decrease the yield.

In the method of the present invention for manufacturing a dielectric memory having the above-described configuration, it is preferable that an opening of the recess is closed with the second insulation film at a level above an upper surface of the second conductive layer.

Further, it is preferable that a sum of a film thickness of the second insulation film formed on the bottom inside the recess and a film thickness of the second insulation film formed in an upper part inside the recess is greater than a film thickness of the second insulation film outside the recess.

Still further, it is preferable that the first conductive layer and the second conductive layer are formed with noble metal materials. Preferably, Pt, Ir, or Ru is used in the noble metal materials.

Still further, it is preferable that the method further includes the step of forming a nitride film or an oxide film containing Ti or Al between the second conductive layer and the second insulation film.

Still further, it is preferable that the second insulation film is a silicon oxide film or a silicon nitride film.

Still further, it is preferable that the method further includes the step of flattening the second insulation film by chemical mechanical polishing after the second insulation film is formed.

The following will describe Embodiments of the present invention while referring to the drawings.

Embodiment 1

FIGS. 1A to 1E are cross-sectional views illustrating steps of a method for manufacturing a dielectric memory according to Embodiment 1 of the present invention.

FIG. 1A illustrates a state in which element films are formed for forming a dielectric memory according to the present embodiment, which is a state prior to the formation of a hard mask. More specifically, an element separation layer 101 and an impurity diffusion layer 102 are formed in a semiconductor substrate 100. On the semiconductor substrate 100, a first interlayer insulation film 103 is formed. On the first interlayer insulation film 103, an insulation lower hydrogen barrier film 104 made of SiN or the like is formed, and contact plugs 105 are formed passing through the first interlayer insulation film 103 and the insulation lower hydrogen barrier film 104, so as to be connected with the impurity diffusion layer 102.

The insulation lower hydrogen barrier film 104 is made of, for example, silicon nitride or titanium aluminum oxide.

Further, a conductive layer 106 connected with the contact plugs 105 is formed on the insulation lower hydrogen barrier film 104, and over the entirety of semiconductor substrate 100 a first insulation layer 107 is formed on the conductive layer 106. Holes 107a are formed in the first insulation film 107 so that the holes 107a expose an upper surface of the conductive layer 106.

Here, the conductive layer 106 is composed of a conductive oxygen barrier film made of, for example, iridium, a conductive hydrogen barrier film made of, for example, titanium aluminum nitride, an electrode film functioning as a lower electrode of a capacitor element, or a stacked film composed of these. The electrode film is made of a noble metal-based material such as Ir, $IrO_2$, or Pt.

Further, lower electrodes 108, composed of a first conductive layer, are formed on bottoms and sidewalls of the holes 107a formed in the first insulation film 107, a capacitor insulation film 109 made of a ferroelectric material is formed on the lower electrodes 108, and a second conductive layer 110 is formed on the capacitor insulation film 109.

Figure 1B:
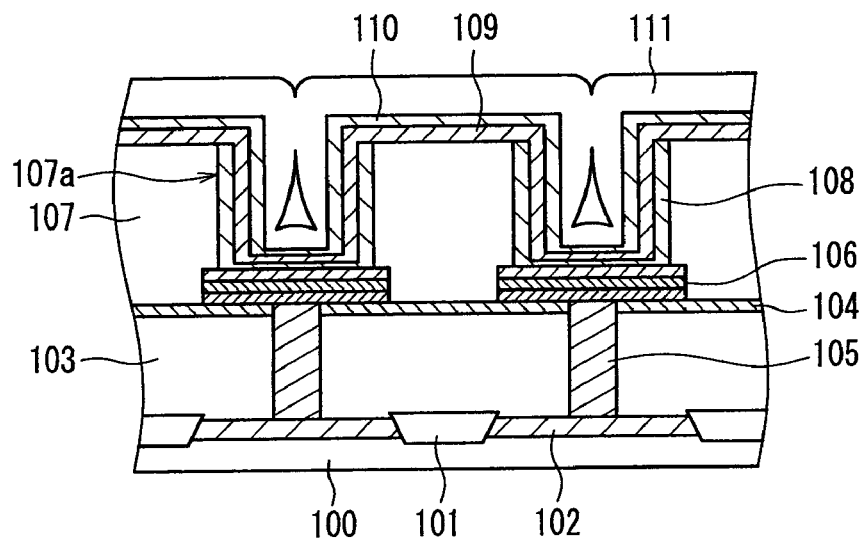

Next, as shown in FIG. 1B, over the entirety of the semiconductor substrate 100, a second insulation film 111 as a hard mask material is formed on the second conductive layer 110. As the second insulation film 111, for example, a silicon oxide film or a silicon nitride film is used preferably. Here, it is a characteristic of the present invention that the second insulation film 111 is formed so as to fill the insides of the holes 107a substantially completely.

Figure 1C:
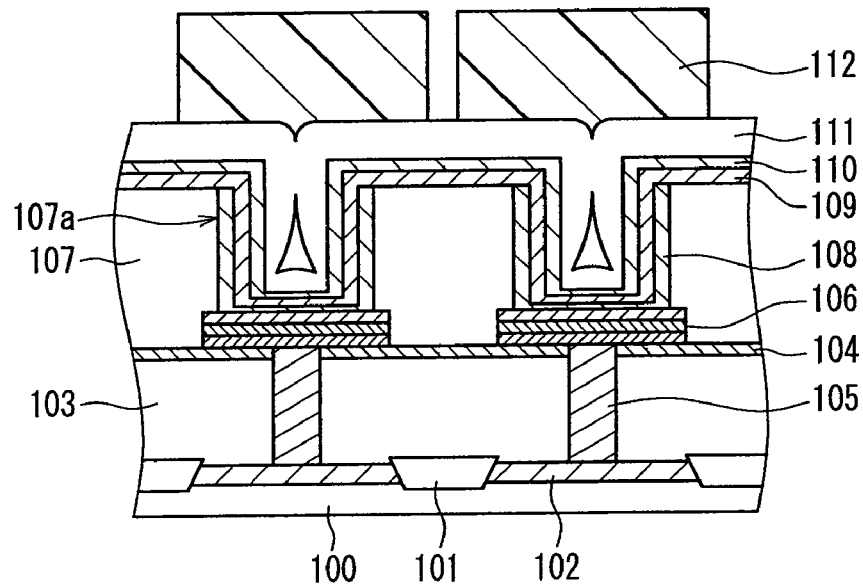
Figure 1D:
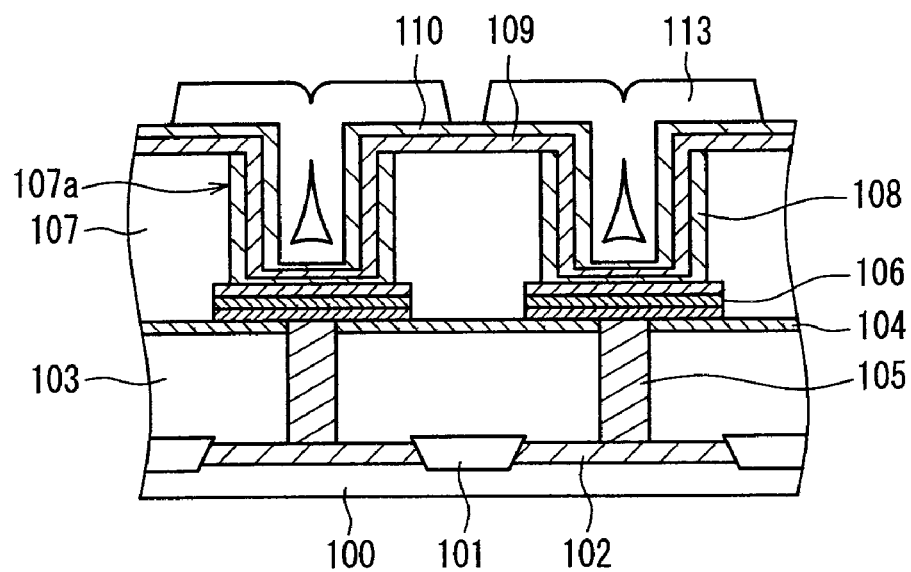

Next, as shown in FIG. 1C, a photoresist 112 having a pattern covering the holes 107a is formed on the second insulation film 111. Next, as shown in FIG. 1D, using a photoresist 112 as a mask, the second insulation film 111 is subjected to patterning by dry etching, so as to form the hard mask 113.

Figure 1E:
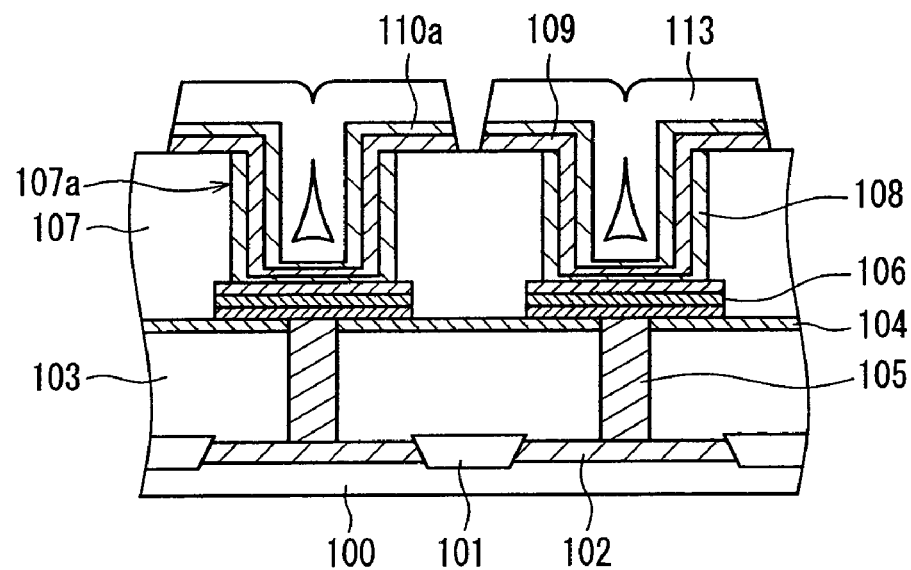

Next, as shown in FIG. 1E, the second conductive layer 110 and the capacitor insulation film 109 are subjected to patterning by dry etching using the hard mask 113, whereby the upper electrodes 110a are formed.

Here, to obtain sufficient etching selectivity ratios of the second conductive layer 110 and the capacitor insulation film 109 with respect to the hard mask 113, it is desirable to use a mixture gas of hydrogen bromide and oxygen for etching the second conductive layer 110, and to use boron chloride for etching the capacitor insulation film 109.

In this step, it is desirable that the thickness of the second insulation film 111 as a hard mask material is such that the second insulation film 111 in the holes 107a has a greater thickness in a direction of the depth of the holes 107a than such a thickness thereof outside the holes 107a on the second conductive layer 110. In other words, the second insulation film 111 fills recesses completely. The state in which the recesses are filled completely means a state in which the second insulation film 111 closes openings of recesses at a level above an upper surface of the second conductive layer 110 outside the holes 107a. There may be cavities in the second insulation film 111 in the holes 107a. Besides, by forming the second insulation film 111 so that the second insulation film 111 has a thickness not less than a radius of the hole 107a, completely closing the recesses is made possible. The reason for this will be described later.

The complete filling of the insides of the recesses with the second insulation film 111 improves adhesion of the second lower electrodes 108, the capacitor insulation film 109, and the upper electrodes 110a by the second insulation film 111, thereby preventing migration of the lower electrodes 108, the capacitor insulation film 109, and the upper electrodes 110a, which may occur when a heat treatment is carried out in a subsequent step. Further, resist residues are not generated inside the recesses when the hard mask 113 is formed by using the resist mask 112. Therefore, the decrease in the yield caused by influences of particles resulting from resist residues can be avoided. Further, since a chemical solution does not remain in the recesses in a washing step after the etching step, damages to a capacitor due to a chemical solution remaining therein do not occur, and hence, the yield is not decreased.

Here, it is not necessary to remove the hard mask 113 used for forming the upper electrodes 110a in a later step, and an insulation film covering the hard mask 113 may be formed over the entirety of the semiconductor substrate 100.

Figure 2A:
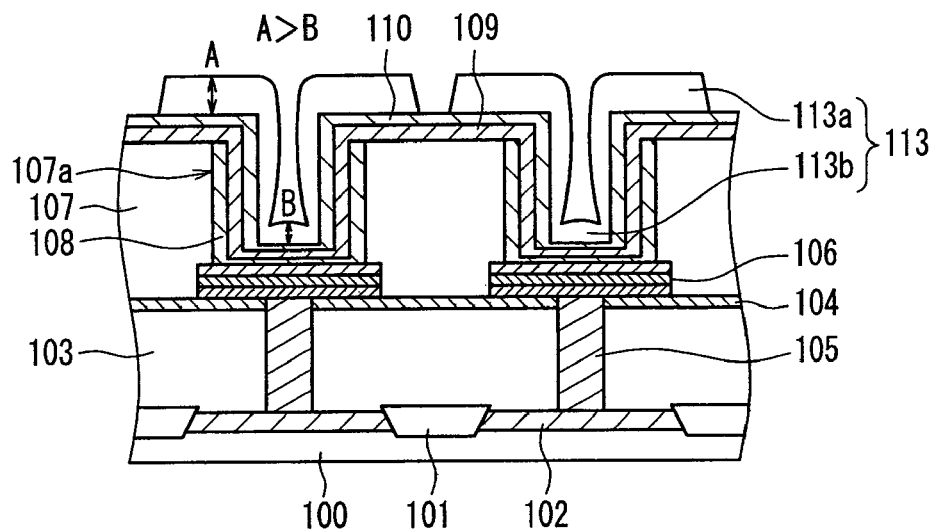
FIGS. 2A and 2B are cross-sectional views of principal parts for explaining the comparison between a hard mask of the present invention and a hard mask of a prior art example.
Figure 2B:
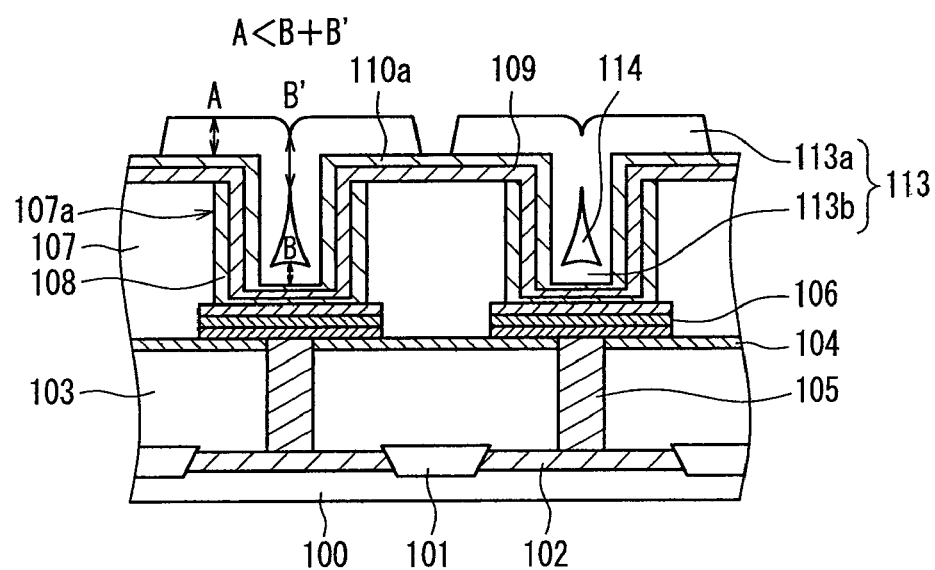

Next, characteristics of the hard mask 113 formed with the second insulation film 111 according to the present embodiment are described more specifically, with reference to FIGS. 2A and 2B. FIGS. 2A and 2B illustrate closed states of recesses depending on the thickness of the second insulation film 111 as the hard mask material.

FIGS. 2A and 2B illustrate states of the hard masks 113, each of which is formed with the second insulation film 111 on the lower electrodes 108 formed inside the recesses, the capacitor insulation film 109, and the second conductive layer 110.

FIG. 2A shows an example of a hard mask that does not satisfy conditions according to the present embodiment. Portions of the hard mask 113 above recesses are referred to as hard mask upper parts 113a, whose film thickness is defined to be "A", and portions of the hard mask 113 on bottoms of the recesses are referred to as hard mask bottom parts 113b, whose film thickness is defined to be "B". "A" and "B" satisfy A>B. This is because with a usual film forming method, it is difficult to cause a film material to enter the insides of the recesses. If A>B, when the second conductive layer 110 and the capacitor insulation film 109 are subjected to etching, the hard mask bottom parts 113b dissipate more quickly than the hard mask upper parts 113a. When the hard mask button parts 113b dissipate during etching, the second conductive layer 110 and the capacitor insulation film 109 on the bottoms of the recesses are etched. As a result, the properties as the ferroelectric capacitor deteriorate. More specifically, a decrease in a remaining polarization amount is caused, affecting the reliability.

On the other hand, in FIG. 2B showing the present embodiment, the second insulation film as a material of the hard mask 113 closes recesses at a level above the upper surface of the second conductive layer 110, thereby completely filling the hard mask 113 into the insides of the recesses. Therefore, in each recess, the second insulation film, which is the material for the hard mask 113, is present above and below a void 114, that is, a cavity. Thus, the void 114 is enclosed by the hard mask 113 completely. It should be noted that desirably no void 114 exists, but in most cases, the void 114 is formed when using a film forming method by which film thicknesses are made different inside and outside recesses.

In the case of FIG. 2B, a sum of a film thickness B of the hard mask bottom part 113b below the void 114 and a film thickness B' of the hard mask 113 above the void 114 is an effective hard mask film thickness inside the recess. Therefore, A≦B+B' is satisfied, and it is possible to elongate a time in which the hard mask bottom parts 113b inside the recesses dissipate in etching, as compared with the time in which the hard mask upper parts 113a dissipate in etching.

Thus, according to the present embodiment in which the hard mask material is filled in the recesses, when a heat treatment is carried out in a later step, migration of an electrode material of the ferroelectric capacitor is suppressed, whereby breaks in wiring layers are suppressed. Further, resist residues are not generated inside the recesses when the hard mask is formed by using the resist mask. Therefore, a decrease in the yield caused by influences of particles resulting from resist residues does not occur. Still further, since a chemical solution does not remain inside the recesses in a washing step subsequent to the etching step, damages to a capacitor due to a chemical solution remaining therein do not occur, and hence, the yield does not decrease.

Embodiment 2

FIGS. 3A to 3F are cross-sectional views illustrating steps of a method for manufacturing a dielectric memory according to Embodiment 2 of the present invention.

In the present embodiment, different from Embodiment 1, a step for forming an adhesion layer 115 (see FIG. 3B) is provided between the step for forming the second conductive layer 110 and the step for forming the second insulation film 111.

Figure 3A:
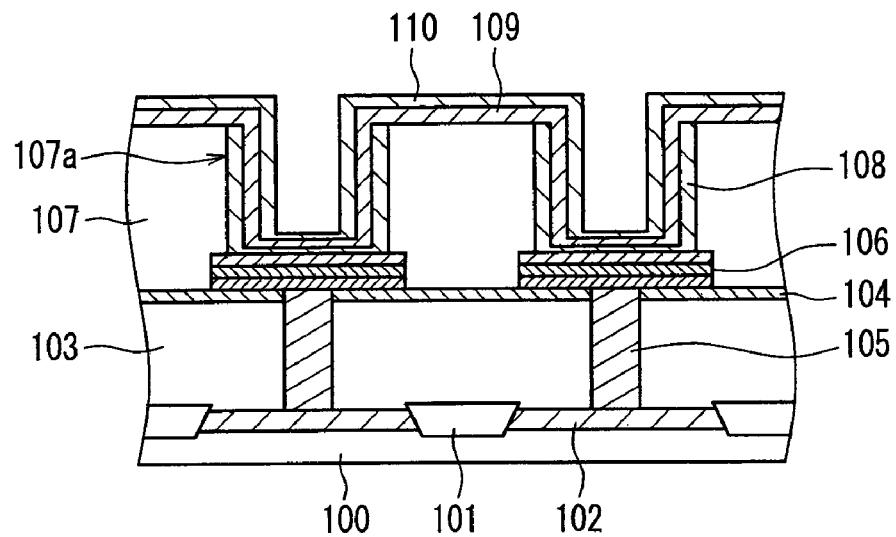
FIGS. 3A to 3F are cross-sectional views illustrating steps of a method for manufacturing a dielectric memory according to Embodiment 2 of the present invention.

FIG. 3A is a cross-sectional view after the second conductive layer 110 is formed. This step is identical to that of Embodiment 1 shown in FIG. 1A. The same elements are designated with the same reference numerals, and the descriptions are not repeated. The present embodiment is described regarding the step subsequent to that, with reference to the cross-sectional structure shown in FIG. 3B.

Figure 3B:
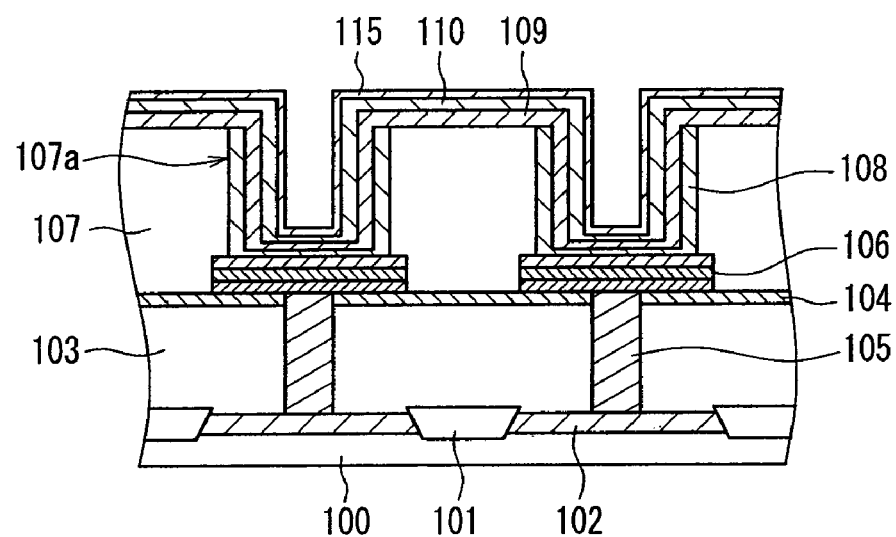

After the second conductive layer 110 is formed, the adhesion layer 115 is formed on the second conductive layer 110 as shown in FIG. 3B.

Figure 3C:
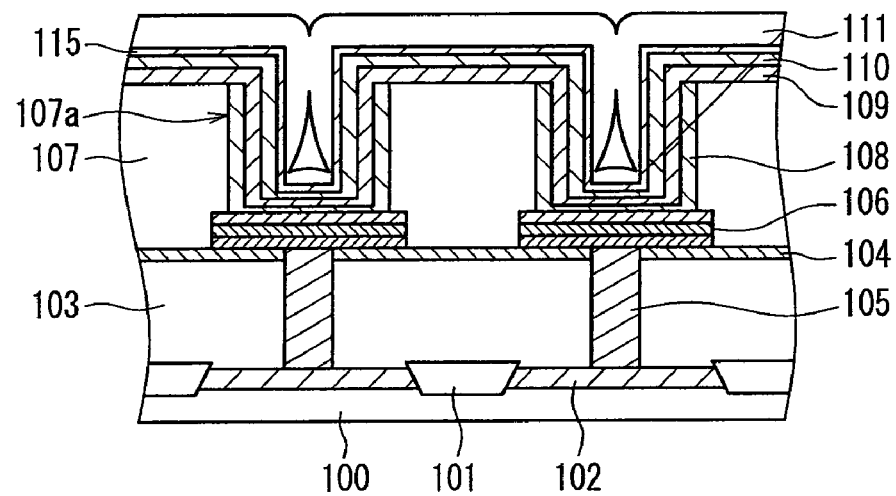

Next, a second insulation film 111 is formed on the adhesion layer 115 as a hard mask material used for forming upper electrodes of the ferroelectric capacitor by etching, as shown in FIG. 3C.

Figure 3D:
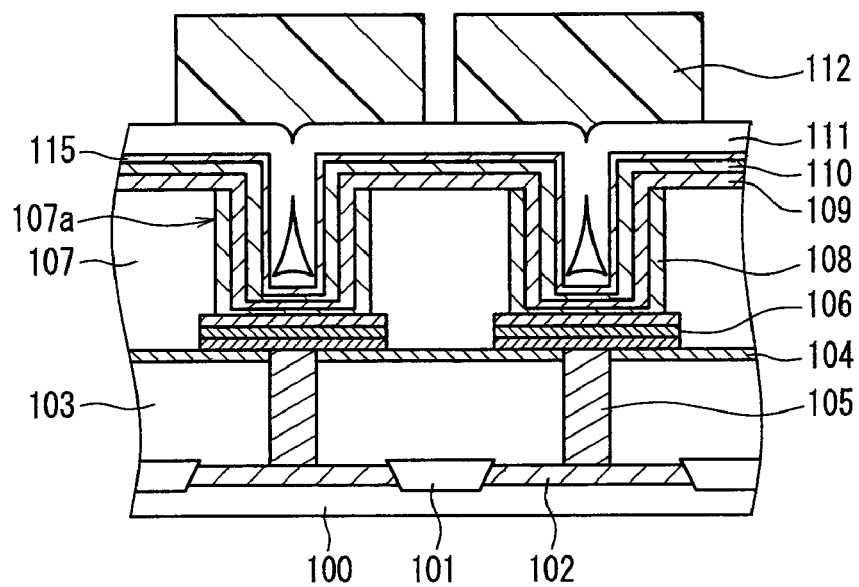

Next, as shown in FIG. 3D, a photoresist 112 to be used for patterning the second insulation film 111 by dry etching is formed.

Figure 3E:
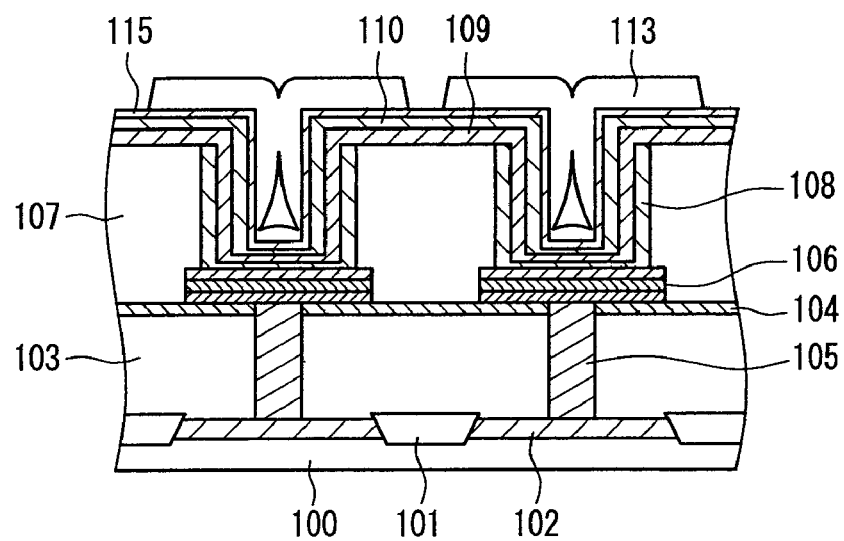

Next, as shown in FIG. 3E, the second insulation film 111 is subjected to patterning by dry etching by using the photoresist 112, whereby a hard mask 113 is formed.

Figure 3F:
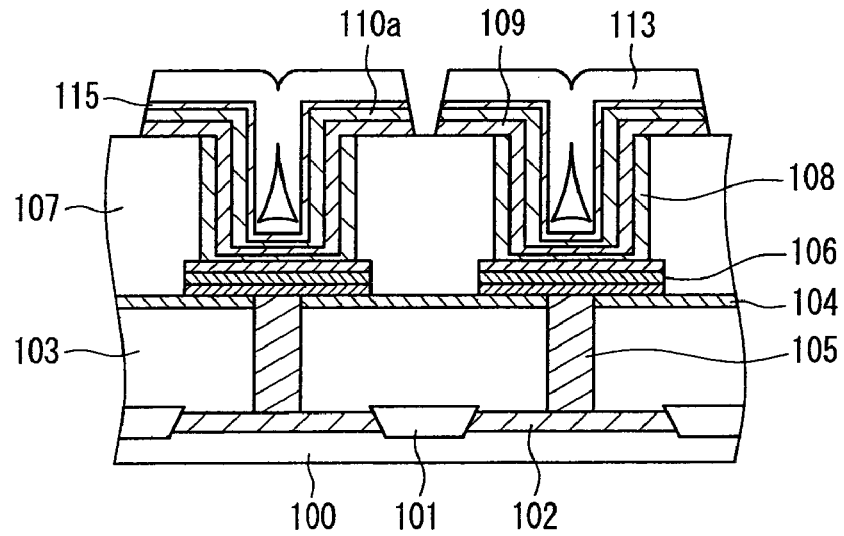

Next, as shown in FIG. 3F, the adhesion layer 115, the second conductive layer 110, and the capacitor insulation film 109 are subjected to patterning by dry etching by using the had mask 113, whereby the ferroelectric capacitor is formed.

Generally, an insulation film such as a silicon oxide film or a silicon nitride film with which the second insulation film 111 is formed has a poor adhesion with respect to a noble metal such as Pt or Ir as a material for the second conductive layer 110. This is because Pt or Ir has a stress, and the stress causes the insulation film to peel off easily. Particularly in the case where a ferroelectric capacitor is formed by a process including a heat treatment in a later step, without an adhesion layer, the insulation film peels off in some cases. Besides, it should be noted that films inside the recesses have stress, so as to peel off easily because of the stress.

Therefore, it is desirable that an adhesion layer is formed between Pt or Ir and an insulation film such as a silicon oxide film or a silicon nitride film. As a material for the adhesion layer 115, an oxide film or a nitride film of Ti or Al is suitable. The adhesion layer may be insulating or conductive.

According to the present embodiment, in addition to the effects achieved by Embodiment 1, the adhesion between the upper electrodes and the second insulation film is improved, whereby more stable capacitor properties can be obtained.

Embodiment 3

Figure 4A:
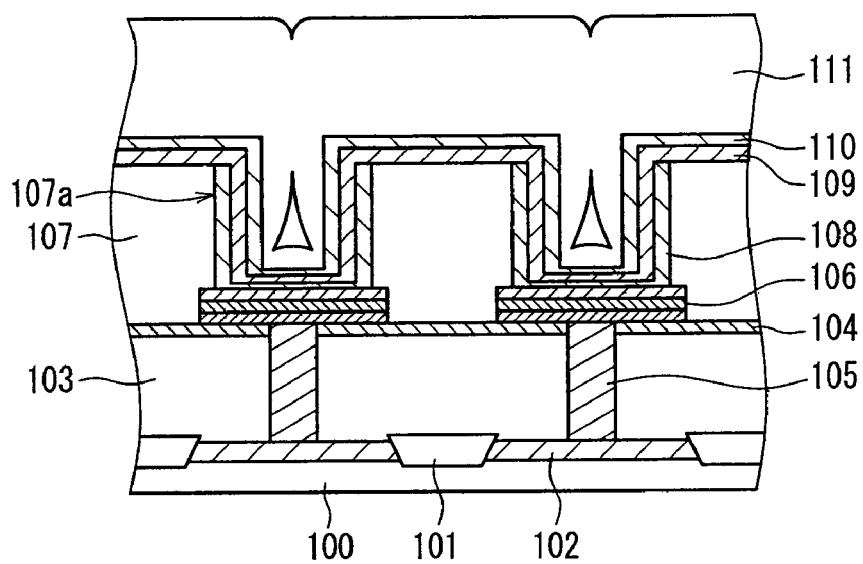
FIGS. 4A to 4C are cross-sectional views illustrating steps of a method for manufacturing a dielectric memory according to Embodiment 3 of the present invention.
Figure 4B:
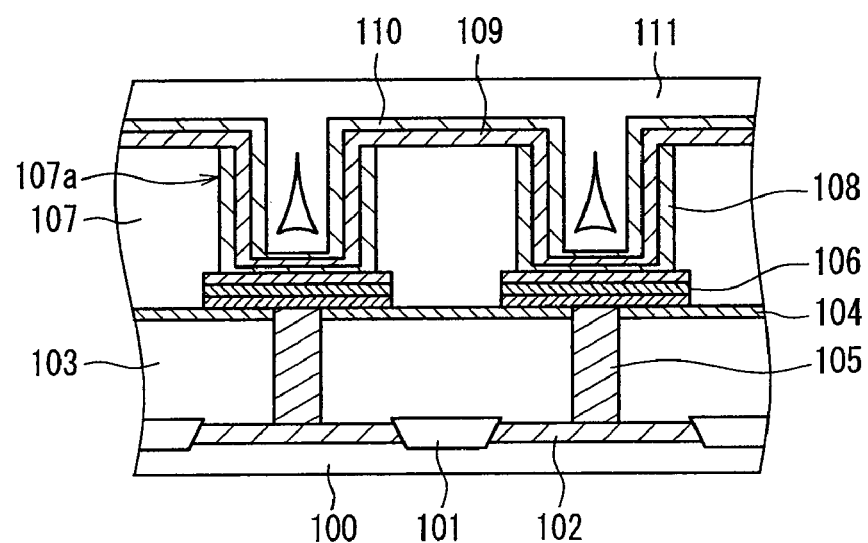
Figure 4C:
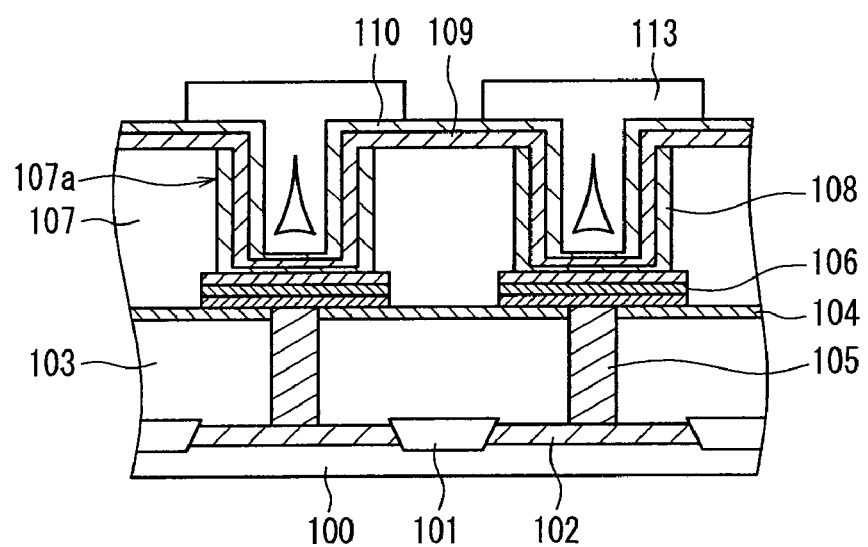

FIGS. 4A to 4C are cross-sectional views illustrating steps of a method for manufacturing a dielectric memory according to Embodiment 3 of the present invention.

The difference of the present embodiment from Embodiment 1 is that after the second insulation film 111 as a hard mask material for forming upper electrodes is formed, the second insulation film 111 is flattened by chemical mechanical polishing (CMP). Descriptions of the same contents as those of Embodiment 1 are not repeated.

FIG. 4A illustrates a state after the same steps for achieving the state shown in FIG. 1B are completed. Next, as shown in FIG. 4B, the second insulation film 111 is flattened by CMP. The steps subsequent to this are identical to those shown in FIGS. 1C to 1E. In FIG. 4C, a state corresponding to the state shown in FIG. 1D is shown in which the hard mask 113 is formed by patterning the second insulation film 111 by dry etching.

Comparing FIG. 4C and FIG. 1D according to Embodiment 1, the configuration of FIG. 4C is different from that of FIG. 1D in that there is no recess on the upper surface of the hard mask 113. For example, if the hard mask 113 has recesses, there is a possibility that the recesses are enlarged after the capacitor insulation film and the upper electrodes are subjected to etching, and results in a poor flatness in the interlayer film formation in a later step, which may cause a break of a wiring layer in a multilayer wiring step. However, according to the present embodiment, by flattening the hard mask 113 previously, flat surfaces are left even after etching, which can reduce the influences on the flatness in the interlayer film formation in later steps.

Further, as the aspect ratio of recesses that form a ferroelectric capacitor decreases, the film thickness of the second insulation film 111 required for filling the insides of the recesses increases. In other words, the film thickness A of the hard mask upper parts 113a shown in FIG. 2B increases. The increase in the thickness of the second insulation film 111 leads to an increase in the thickness of portions of the hard mask remaining after the formation of the upper electrodes for the ferroelectric capacitor. This makes a burying property poorer in the formation of the interlayer insulation film in a later step. Therefore, it is desirable that a portion of the second insulation film 111 that is more than the necessary range is removed by CMP.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a dielectric memory, comprising the steps of:
    forming a first insulation film on a substrate;
    forming a hole in the first insulation film;
    forming a first conductive layer on a bottom surface and a sidewall surface of the hole;
    forming a dielectric layer on the first conductive layer;
    forming a second conductive layer on the dielectric layer;
    forming a second insulation film on the second conductive layer so that the second insulation film fills a recess corresponding to the hole;
    forming a resist mask on the second insulation film so that the resist mask covers the recess;
    patterning the second insulation film by using the resist mask; and
    patterning the second conductive layer and the dielectric layer by using the patterned second insulation film as a hard mask,
    wherein in the step of forming the second insulation film, an opening of the recess is closed with the second insulation film at a level above an upper surface of the second conductive layer, thereby forming a void within the recess.

2. The method according to claim 1, wherein a sum of a film thickness of the second insulation film formed on the bottom inside the recess and a film thickness of the second insulation film formed in an upper part inside the recess is greater than a film thickness of the second insulation film outside the recess.

3. The method according to claim 1, wherein the first conductive layer and the second conductive layer are formed with noble metal materials.

4. The method according to claim 3, wherein Pt, Ir, or Ru is used in the noble metal materials.

5. The method according to claim 1, further comprising the step of:
    forming a nitride film or an oxide film containing Ti or Al between the second conductive layer and the second insulation film.

6. The method according to claim 1, wherein the second insulation film is a silicon oxide film or a silicon nitride film.

7. The method according to claim 1, further comprising the step of:
    flattening the second insulation film by chemical mechanical polishing after the second insulation film is formed.

8. The method according to claim 1, further comprising the step of:
    forming a third insulation film on the substrate so that the third insulation film covers the second insulation film, after the step of patterning the dielectric layer.

* * * * *